US012753486B2

(12) United States Patent
Pagnon

(10) Patent No.: US 12,753,486 B2
(45) Date of Patent: Oct. 6, 2026

(54) OPTIMIZED CRUCIBLE ASSEMBLY AND METHOD FOR PHYSICAL VAPOR DEPOSITION

(71) Applicant: Essilor International, Charenton-le-Pont (FR)

(72) Inventor: Philippe Pagnon, Dijon (FR)

(73) Assignee: Essilor International, Charenton-le-pont (FR)

( * ) Notice: Subject to any disclaimer, the term of this patent is extended or adjusted under 35 U.S.C. 154(b) by 432 days.

(21) Appl. No.: 17/784,849

(22) PCT Filed: Dec. 18, 2020

(86) PCT No.: PCT/EP2020/087199
§ 371 (c)(1),
(2) Date: Jun. 13, 2022

(87) PCT Pub. No.: WO2021/123293
PCT Pub. Date: Jun. 24, 2021

(65) Prior Publication Data

US 2023/0002880 A1 Jan. 5, 2023

(30) Foreign Application Priority Data

Dec. 20, 2019 (EP) .................................... 19306730

(51) Int. Cl.
*C23C 14/24* (2006.01)
*C23C 14/30* (2006.01)

(52) U.S. Cl.
CPC ............ *C23C 14/243* (2013.01); *C23C 14/30* (2013.01)

(58) Field of Classification Search
CPC .................................................... C23C 14/243
See application file for complete search history.

(56) References Cited

U.S. PATENT DOCUMENTS 2,347,825 A * 5/1944 Hanks .................. A61M 11/041 392/338
2,482,329 A * 9/1949 Dimmick ................ C23C 14/24 118/727

(Continued)

FOREIGN PATENT DOCUMENTS

CN 1946873 * 4/2007 ............ C23C 14/24
CN 104988462 10/2015

(Continued)

OTHER PUBLICATIONS

Extended European Search Report in corresponding EP Application No. 19306730.3 Dated Jul. 9, 2020.

*Primary Examiner* — Keath T Chen
(74) *Attorney, Agent, or Firm* — Norton Rose Fulbright US LLP

(57) ABSTRACT

The invention concerns a crucible assembly for physical vapor deposition on a surface comprising: —a base (22) to support and drive in rotation a crucible (18) around a rotational axis (A), the base comprising a base upper surface (34) having a first alignment relief (30), —a crucible (18) comprising: —at least one cavity (24) disposed at a peripheral area (38) of the crucible (18) with regard to the rotational axis (A), —a crucible bottom surface (25) intended to contact the base upper surface (34) of the base (22), the crucible bottom surface (25) having a second alignment relief (32) which is complementary shaped with regard to the first alignment relief (30), the second (32) alignment relief being disposed at a central area (36) of the crucible (18) with regard to the rotation axis (A).

11 Claims, 6 Drawing Sheets

(56) References Cited

U.S. PATENT DOCUMENTS

| | | | | |
|---|---|---|---|---|
| 3,655,903 | A * | 4/1972 | Roman .................. | C23C 14/32 373/13 |
| 4,115,653 | A | 9/1978 | Kienel et al. | |
| 4,632,059 | A | 12/1986 | Flatscher et al. | |
| 5,320,680 | A * | 6/1994 | Learn ................ | C23C 16/45504 118/724 |
| 5,473,627 | A * | 12/1995 | Tsujimoto ........... | H01J 37/3053 118/726 |
| 2004/0191407 | A1 | 9/2004 | Ohbayashi | |
| 2010/0031888 | A1* | 2/2010 | Priddy .................. | C23C 14/243 439/82 |
| 2013/0011582 | A1* | 1/2013 | Lin ......................... | H01J 37/20 219/121.21 |
| 2013/0107369 | A1* | 5/2013 | Seki ........................ | B05C 11/00 428/156 |
| 2016/0258052 | A1* | 9/2016 | Wang ...................... | C23C 14/24 |
| 2019/0186003 | A1* | 6/2019 | Eldridge ............. | C23C 16/4481 |
| 2022/0018013 | A1* | 1/2022 | Kroneberger ........... | F27B 14/12 |

FOREIGN PATENT DOCUMENTS

| | | | | |
|---|---|---|---|---|
| EP | 1160351 | | 12/2001 | |
| KR | 20140026102 | * | 3/2014 | ........... C23C 14/548 |

* cited by examiner

OPTIMIZED CRUCIBLE ASSEMBLY AND METHOD FOR PHYSICAL VAPOR DEPOSITION

CROSS-REFERENCE TO RELATED APPLICATIONS

This application is a national phase application under 35 U.S.C. § 371 of International Application No. PCT/EP2020/087199 filed 18 Dec. 2020, which claims priority to European Patent Application No. 19306730.3 filed 20 Dec. 2019. The entire contents of each of the above-referenced disclosures is specifically incorporated by reference herein without disclaimer.

The invention concerns a crucible assembly for physical vapor deposition of a material layer on a surface, for example on an ophthalmic lens. The invention further concerns a method for physical vapor deposition using such kind of crucible assembly.

Layer deposition is a process applied in many industries to form coating so as to protect surfaces and/or to impart a variety of desired properties to said surfaces. For example, in optics, an antireflective or anti-reflection (AR) layer is a type of optical layer applied to the surface of lenses or other optical devices to reduce reflection.

Physical Vapor Deposition is a well-known process performed under vacuum in which a target consisting of a material is bombarded with an energy beam. The energy beam causes atoms from the target to transform into the gaseous phase. These atoms then precipitate into solid form, coating simultaneously the plurality of substrates in a vacuum container with a layer of the material.

Material to be vaporized is generally disposed in a material container, lodged in a cavity of a crucible. Said crucible is configured to cool the material container along with the material so as to dissipate the large amount of heat generated by the energy beam bombarding. In use, the material is bombarded with the energy beam to be vaporized and then deposited onto a surface. When a container has not enough material therein, the container is manually removed from the crucible by an operator, cleaned and filled with new material. This replacement operation entails significant costs, especially because the layer deposition machine has to be stopped during this operation. Furthermore, the replacement operation may be risky due to the high temperatures of the crucible and the container.

A problem that the invention aims to solve is to provide a crucible assembly for physical vapor deposition allowing to improve the efficiency of the process while making it safer for the operator.

To solve this problem, the invention provides a crucible assembly for physical vapor deposition on a surface comprising:

- a base to support and drive in rotation a crucible around a rotational axis, the base comprising a base upper surface having a first alignment relief,
- a crucible comprising:
  - at least one cavity for receiving a material to be vaporized by an electron beam gun on the surface, the at least one cavity being disposed at a peripheral area of the crucible with regard to the rotational axis,
  - a crucible bottom surface intended to contact the base upper surface of the base, the crucible bottom surface having a second alignment relief which is complementary shaped with regard to the first alignment relief so as to align both the base and the crucible with regard to the rotational axis when the crucible bottom surface contacts the base upper surface and the first and second alignment reliefs are brought one into the other, the second alignment relief being disposed at a central area of the crucible with regard to the rotation axis.

Providing the crucible and the base with alignment reliefs that are disposed at a central area of the crucible near the rotational axis allows to increase the number of cavities that can be provided to the crucible for a same external dimension of the crucible.

It has been observed that the maximum external dimension of the crucible (maximum diameter when the crucible is circular) available to provide the cavities depends on the location of the alignment reliefs. Indeed, cavities formed in the crucible generally have a depth which is close to the thickness of the crucible. Since an alignment relief may be at least partly formed as a depression, an alignment relief may prevent a cavity to be provided at the same position. For a given external diameter of the crucible, the maximum available diameter to provide the cavities is thus greater when the alignment reliefs are provided at the central area of the crucible compared to providing this alignment reliefs at a peripheral area.

Hence, the crucible is arranged such that the peripheral area is free from alignment reliefs allowing to provide cavities at a greater distance from the rotational axis. Therefore, more cavities of a given diameter may be provided in a crucible with the alignment reliefs at the central area.

A crucible with a greater number of cavities allows to load more material within the crucible. This reduces the number of replacement operations that have to be performed during the operation of the machine thereby allowing to improve the efficiency of the process. Furthermore, reducing the number of replacement operations allows to make the process less risky for the operator.

Known crucibles generally comprise six to eight cavities whereas a crucible with ten cavities has been accomplished with alignment reliefs disposed at the central area of the crucible. This is particularly relevant with regard to new anti-reflective coating processes which require ten or more successive layers of material. A greater number of cavities allows to prevent the same material to be used several times and to thus improve the colorimetric stability of the coating, notably when the material is silica.

According to an embodiment of crucible assembly, the crucible comprises at least ten cavities disposed at the peripheral area around the rotational axis.

According to an embodiment of crucible assembly, the crucible comprises a crucible upper surface from which the at least one cavity extends, the crucible upper surface being a circular surface centered around the rotational axis and defining an external diameter, and wherein:

- the central area is a circular area extending around the rotational axis up to 60% of the external diameter, and/or
- the peripheral area is an annular area extending around the rotational axis from 61% to 100% of the external diameter.

According to an embodiment of crucible assembly, the first and second alignment relief are on among: a depression formed in a surface or a protrusion protruding from a surface.

According to an embodiment of crucible assembly, the base upper surface further comprises a first orientation relief, the crucible bottom surface further comprising a second orientation relief which is complementary shaped with regard to the first alignment relief so as to position the crucible at a predetermined angular orientation with regard to the base when the crucible bottom surface contacts the base upper surface and the first and second orientation reliefs are brought one into the other.

According to an embodiment of crucible assembly, the second orientation relief is positioned at the central area of the crucible.

According to an embodiment of crucible assembly, the dimension of the first orientation relief along the rotational axis is smaller than the dimension of the first alignment relief along said rotational axis.

According to an embodiment of crucible assembly, the first and second alignment reliefs provide an alignment stop of the crucible along at least one direction perpendicular to the rotational axis.

According to an embodiment of crucible assembly, the crucible comprises a crucible upper surface from which the at least one cavity extends, the crucible comprising a crucible handle extending from the crucible upper surface.

According to an embodiment of crucible assembly, the crucible comprises at least two cavities, the crucible assembly further comprising a crucible cover configured to cover at least one of the cavities when the crucible cover is disposed above the crucible, the crucible cover having a hole configured to make the crucible handle extend through the crucible cover when disposed above the crucible.

According to an embodiment of crucible assembly, the crucible cover comprises a cover handle extending from a cover upper surface of the crucible cover.

According to an embodiment of crucible assembly, the base is disk-shaped with the base upper surface provided on one side of the disk, the first alignment relief comprising a protrusion centered with regard to the rotational axis.

According to an embodiment of crucible assembly, the crucible is disk-shaped with the crucible bottom and upper surfaces provided on each side of the disk, the second alignment relief comprising a depression centered with regard to the rotational axis.

The invention further provides a method for depositing a coating on a surface using a machine for physical vapor deposition comprising:

- a vacuum container,
- at least one surface to be coated disposed into the vacuum container,
- a crucible assembly disposed into the vacuum container and having a base configured to cool and drive in rotation a crucible, the crucible assembly comprising a first and a second crucibles each having a plurality of cavities for receiving at least one material to be vaporized,
- an electron beam gun to vaporize the at least one material, the method comprising the following steps:

- providing the cavities of the first and second crucibles respectively with a first and a second set of materials,
- positioning the first crucible having the first set of materials onto the base,
- actuating the electron beam gun to vaporize at least one material received in cavity of the first crucible,
- removing the first crucible from the base,
- positioning the second crucible having the second set of materials onto the base.

According to an embodiment of depositing method, the crucible assembly is a crucible assembly as described above.

The invention is described in more detail below by way of the figures that show only one preferred embodiment of the invention.

Figure 1:
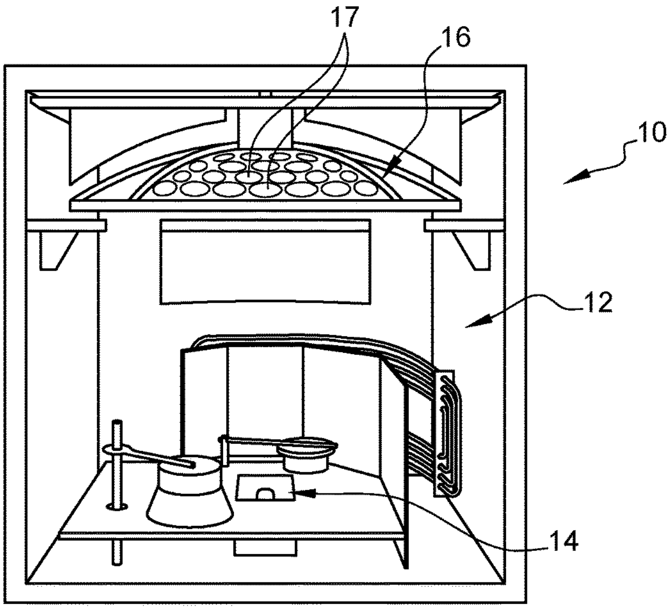
FIG. 1 shows a machine for physical vapor deposition comprising a vacuum container and a crucible assembly therein.
Figure 2:
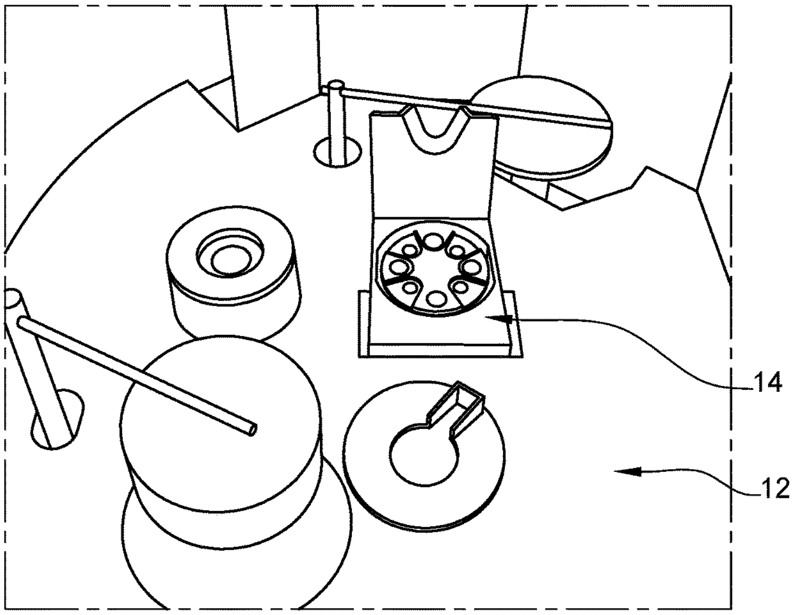
FIG. 2 shows a detailed view of the vacuum container and the crucible assembly of the machine for physical vapor deposition.

As shown on FIGS. 1 and 2, a physical vapor deposition machine 10 comprises a vacuum container 12 which can be selectively put under vacuum as well as a crucible assembly 14 disposed within the vacuum container 12. The physical vapor deposition machine 10 also comprises a carrousel 16 forming a bell on which a surface 17 to be coated is disposed. The surface 17 may be any surface on which a coating can be deposited. In a preferred embodiment, the surface 17 is a surface of an ophthalmic lens. The coating deposited by vapor deposition is preferably an anti-reflective layer. The crucible assembly 14 is preferably disposed at the center of the vacuum container 12 with the carrousel 16 above the crucible assembly 14. The physical vapor deposition further comprises an electron beam gun (not shown) to vaporize material disposed within the crucible assembly 14.

Figure 3:
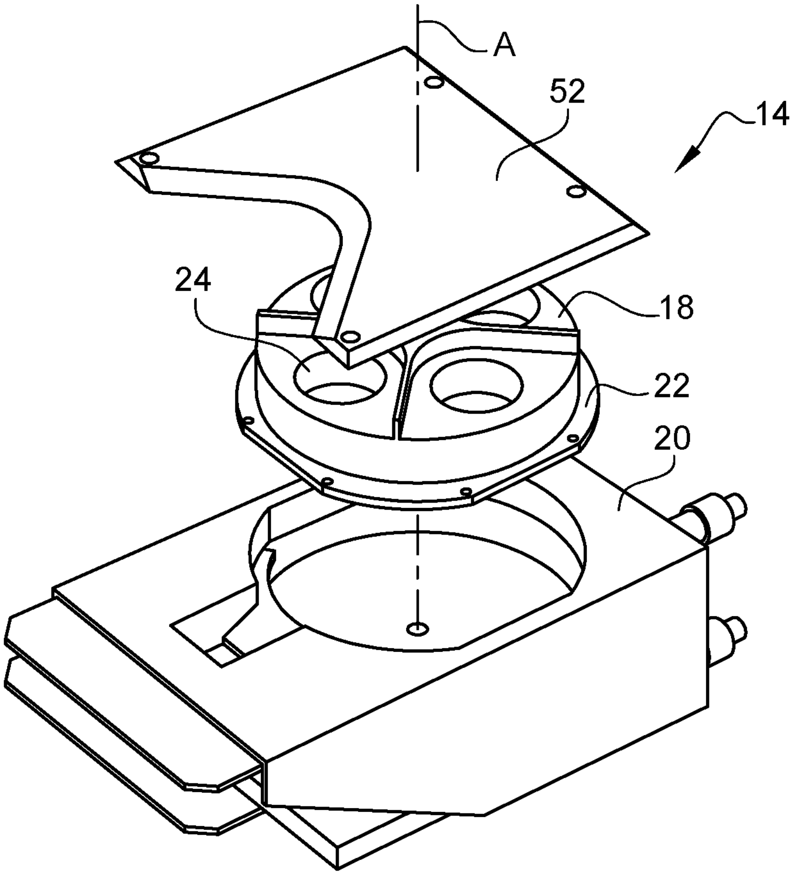
FIG. 3 shows an exploded view of the crucible assembly comprising a base and a crucible connected together, a support and a crucible cover.

As shown on FIG. 3, crucible assembly 14 comprises a crucible 18 configured to receive material to be vaporized, a support 20 and a base 22 for connecting the crucible 18 to the support 20. The crucible 18 and the base 22 are shown in contact with each other in a connected position. In the connected position, a crucible bottom surface 25 is in contact with a base upper surface 34. The crucible bottom surface 25 is disposed opposite a crucible upper surface 26 at which material to be vaporized is received. In this connected position, the crucible 18 is operational to perform physical vapor deposition when the based is fixed to the support 20.

Crucible 18 comprises a plurality of cavities 24 wherein material to be vaporized is received. Preferably, the crucible 18 comprises at least ten cavities 24. Material may be received in a removable container disposed in one or more cavities 24 to ease the material replacement and cleaning operation. The cavities 24 are formed on the crucible upper surface 26. In other words, cavities 24 form a blind hole within the crucible 18 opening onto the crucible upper surface 26. More generally, crucible 18 is disk-shaped with the crucible bottom 25 and upper 26 surfaces provided on each side of the disk with a circular crucible side surface 28 provided between said crucible bottom 25 and upper 26 surfaces. Cavities 24 are preferably arranged in a circular configuration on the crucible upper surface 26.

Bombarding the material received in the cavities 24 greatly increases the temperature of the material as well as the temperature of the crucible 18. A cooling circuit is provided in the support 20 to allow to cool the material received in the cavities 24. The cooling circuit cools the material by cooling the base 22, the crucible 18 is then cooled by thermal conduction between the crucible 18 and the base 22. The crucible 18 and the base 22 are preferably made in a material favoring thermal conduction, as copper.

The support 20 also comprises a driving device configured to drive in rotation the base 22 around a rotational axis A. The rotary motion is then transmitted to the crucible 18 by the base 22. Rotating the crucible 18 around the rotational axis A allows to change the position of the cavities 24 to thus place a predetermined cavity 24 in front of the electron beam gun. This rotation may be performed using a rotation platform onto which the base 22 is disposed. The base 22 is configured to rotate the crucible 18 around the rotational axis A when connected to the crucible 18. In other words, the base 22 which is fixed to the support 20 forms a rotating carrousel to rotate the crucible 18. The circular configuration of the cavities 24 is centered on the rotational axis A so that the rotation of the crucible 18 allows to move the cavities 24 around the rotational axis A. This allows to place a predetermined cavity 24 and thus a predetermined material in front of the electron beam gun. A controller is also provided to control the driving device and to thereby control which cavity 24 of the crucible 18 is disposed in front of the electron beam.

Connection between the base 22 and the crucible 18 is performed with a first alignment relief 30 provided on the base 22 and a second alignment relief 32 provided on the crucible 18. By "relief", we mean a depression, a protrusion or a combination thereof extending from a surface of the base 22 or the crucible 18. First 30 and second 32 alignment reliefs are configured to fit together to connect the crucible 18 with the base 22. By "fit together", we mean that one of the first 30 and second 32 alignment reliefs may be inserted into the other. First 30 and second 32 alignment reliefs are preferably complementary shaped to ease connection between the crucible 18 and the base 22.

According to a preferred embodiment, one among the first 30 and second 32 alignment reliefs forms a protrusion configured to fit into a depression formed by the other of the first 30 and second 32 alignment reliefs. Most preferably, the first alignment relief 30 forms a protrusion and the second alignment relief 32 forms a depression. This configuration allows to form a plug-and-play connection between the crucible 18 and the base 22. Furthermore, it allows to have a planar crucible bottom surface 25, i.e. without protrusions, thereby improving the stability of the crucible 18 when put onto another surface.

First 30 and second 32 alignment reliefs provide an alignment stop of the crucible 18 along at least one direction perpendicular to the rotational axis A. Since the base 22 is fixed to the support 20, first 30 and second 32 alignment reliefs allow to position the crucible 18 with regard to the base 22 at least along one direction when they are fit together. Most preferably, first 30 and second 32 alignment reliefs are configured to position the crucible 18 along at least two directions perpendicular to the rotational axis A.

Figure 5:
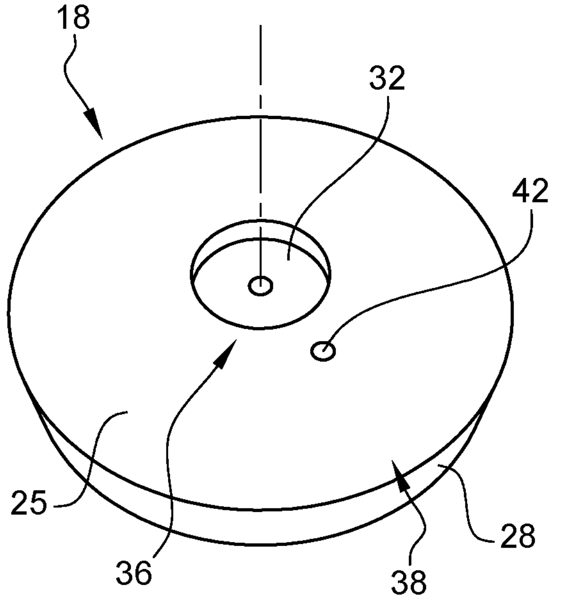
Figure 6:
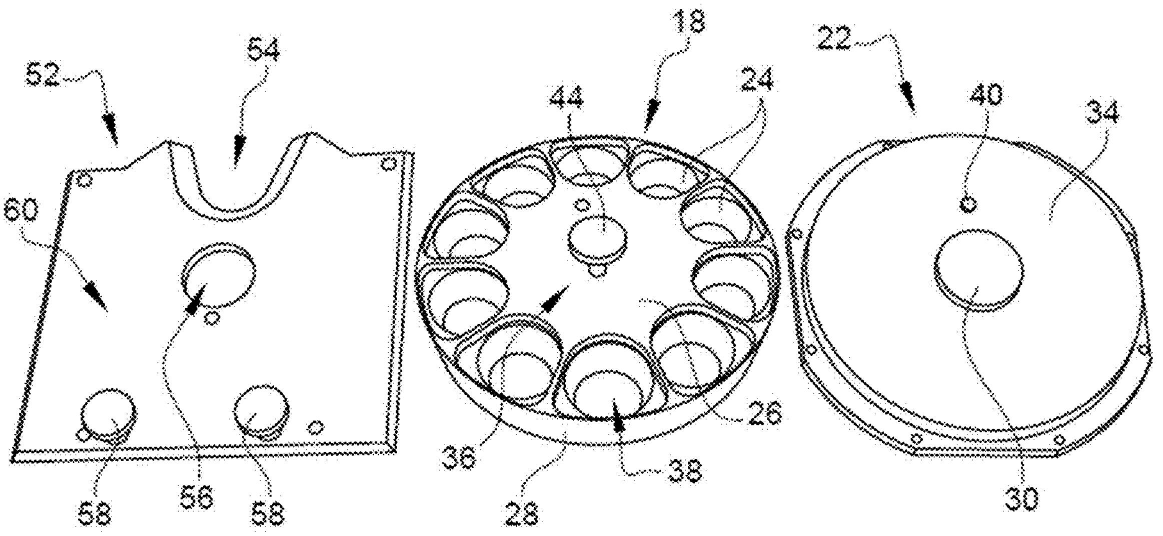
FIG. 6 shows a top view of the cover, the crucible and the base.

First 30 and second 32 alignment reliefs have preferably a circular cross-section, as shown on FIGS. 5 and 6. A circular cross-section allows the crucible 18 to be positioned along two directions when the first and the second alignment reliefs are brought into contact thereby improving the positioning of the crucible 18 with regard to the base 22. A circular cross-section has the advantage to be easily manufactured. As shown on FIGS. 5 and 6, first alignment relief 30 may be a cylindrical protrusion protruding from the base upper surface 34. This base upper surface 34 is intended to contact the crucible bottom surface 25 when the crucible 18 and the base 22 are connected together. The second alignment relief 32 may be a cylindrical depression formed on the crucible bottom surface 25. Alternatively, the first alignment relief 30 may be a cylindrical depression and the second alignment relief 32 may be a cylindrical protrusion. In another alternative embodiment, first 30 and second 32 alignment reliefs may be of any shape allowing to stop the crucible along at least one, preferably two, direction perpendicular to the rotational axis A. Furthermore, one of the first 30 and second 32 alignment reliefs may be a depression with an insert configured to be inserted into said depression to form a protrusion.

The first 30 and second 32 alignment reliefs are preferably centered with regard to the rotational axis A so as to align both the base 22 and the crucible 18 with regard to the rotational axis A when the crucible bottom surface 25 contacts the base upper surface 34 and the first 30 and second 32 alignment reliefs are brought one into the other. Providing centered first 30 and second 32 alignment reliefs allows to facilitate connecting the crucible 18 to the base 22 because it is generally more intuitive and simpler to fit two parts together when the connection interface is centered.

As shown on FIGS. 4 to 7, the crucible 18 forms a central area 36 centered around the rotation axis A and a peripheral area 38 around the central area 36. The second alignment relief 32 is disposed at the central area of the crucible 18 and the cavities 24 are disposed at the peripheral area 38. As described above, the crucible 18 is arranged such that the peripheral area 38 is free from alignment reliefs allowing to provide cavities 24 at a greater distance from the rotational axis A. Therefore, more cavities 24 of a given diameter may be provided in the crucible 18 with the second alignment relief 32 disposed at the central area 36. Particularly, it allows the crucible 18 to have more than height cavities and, preferably, at least ten cavities of an external diameter at the crucible upper surface 26 of 28.97 mm for a crucible external diameter of 133.00 mm. In line with this arrangement, the first alignment relief 30 is also provided in a central area of the base 22, with the first alignment relief 30 aligned with or facing the second alignment relief 32 when the crucible 18 is connected to the base 22.

Figure 4:
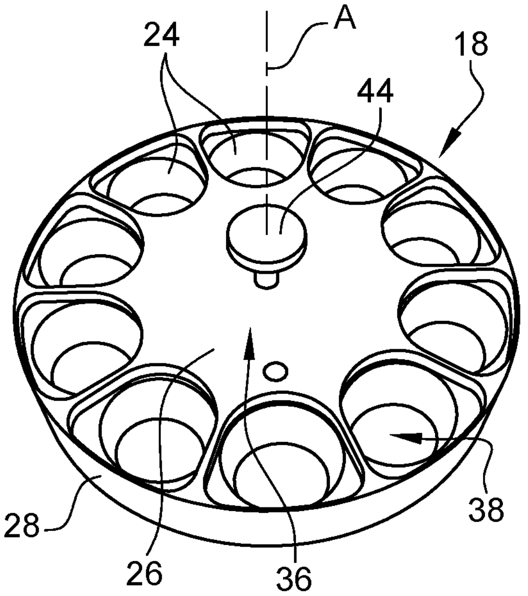
FIGS. 4 and 5 show respectively top and bottom views of the crucible of the crucible assembly.
Figure 8:
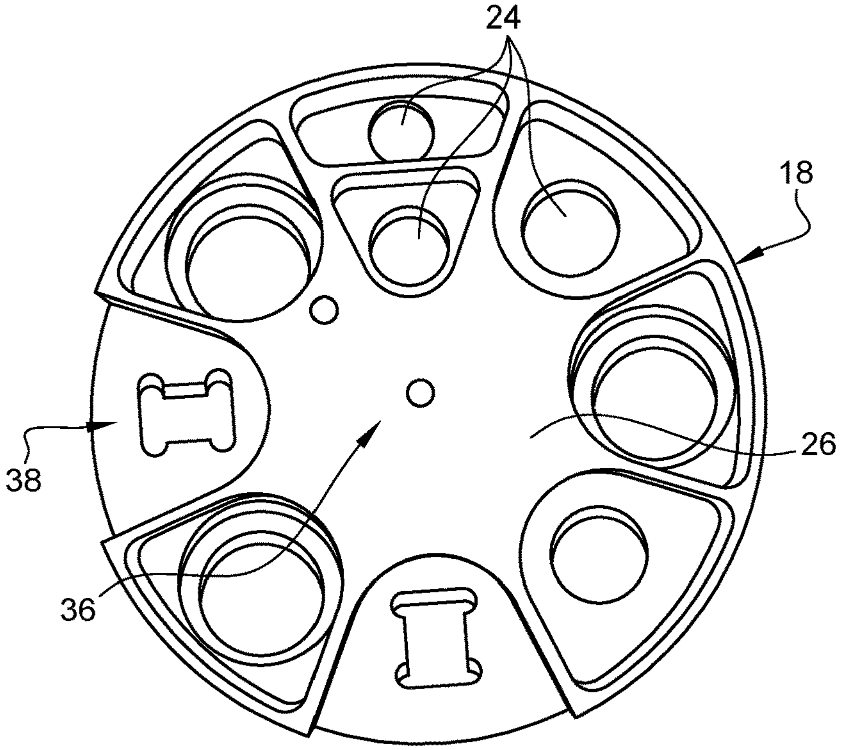
FIG. 8 shows an alternative embodiment of a crucible.

As shown on FIG. 4, all the cavities 24 of the crucible 18 may have the same dimensions and shape thereby providing a uniform distribution of the cavities 24 at a same distance from the rotational axis A. Alternatively, the cavities 24 may not have the same shape and/or dimension and may be provided at a different distance from the rotational axis A. Particularly, two cavities 24 may be provided on a same radius but at a different distance from the rotational axis A, as shown on FIG. 8. It allows to provide more cavities 24 to the crucible 18 to be able to vaporize more different material to apply more layers to the lens. The smaller cavities 24 (with an external diameter from 10 to 20 mm) may be used for vaporizing non-optical layers such as magnesium fluoride (MgF2), magnesium oxide (MGO), tin dioxide (SnO2) and Indium tin oxide (ITO).

The crucible upper surface 26 from which the at least one cavity 24 extends is preferably a circular surface centered on the rotational axis A. Thus, the crucible upper surface 26 defines an external diameter between two portions of an external edge of the crucible 18. The central area 36 is preferably a circular area extending around the rotational axis A and having a diameter up to 50% of the external diameter of the crucible upper surface 26. The peripheral area 38 is defined as the remaining portion of the crucible upper surface 26. Most preferably, the central area 36 is a circular area extending around the rotational axis A and having a diameter up to 60% of the external diameter of the crucible upper surface 26. The central area is preferably centered with regard to the rotational axis A. The peripheral area 38 is preferably an annular area extending around the rotational axis A and having a dimension along a direction perpendicular to the rotational axis A from 61% to 100% of the external diameter of the crucible 18.

The crucible assembly 14 further comprises orientation reliefs allowing to set an angular position of the crucible 18 with regard to the base 22. Particularly, orientation reliefs allow to position the crucible 18 at a predetermined angular orientation around the rotational axis A with regard to the base 22 when the crucible bottom surface 25 contacts the base upper surface 34 and when the first 30 and second 32 alignment reliefs are brought one into the other. Since the base 22 is fixed to the support 20, orientation reliefs allow to set the angular position of the crucible 18 with regard to the support 20.

The orientation reliefs comprise a first orientation relief 40 formed on the base 22 and a second orientation relief 42 formed on the crucible 18. Particularly, the first orientation relief 40 is provided at the base upper surface 34 and the second orientation relief 42 is provided at the crucible bottom surface 25. First 40 and second 42 orientation reliefs are configured to fit together to connect the crucible 18 with the base 22. By "fit together", we mean that one of the first 30 and second 32 alignment reliefs may be inserted into the other.

First 40 and second 42 orientation reliefs are preferably complementary shaped to ease connection between the crucible 18 and the base 22. Each of the first 40 and second 42 orientation reliefs may be formed by a protrusion, a depression or a combination thereof extending from a surface of the base 22 or the crucible 18.

According to a preferred embodiment, one among the first 40 and second 42 orientation reliefs forms a protrusion configured to fit into a depression formed by the other of the first 40 and second 42 orientation reliefs. Preferably, first 40 and second 42 orientation reliefs at least partly extend in a direction parallel to the rotational axis A to prevent any relative rotation between the crucible 18 and the base 22 when first 40 and second 42 orientation reliefs are fitted together. Most preferably, the first orientation relief 40 forms a protrusion and the second orientation relief 42 forms a depression. This configuration allows to form a plug-and-play connection between the crucible 18 and the base 22. Furthermore, it allows to have a planar crucible bottom surface 25, i.e. without protrusions, thereby improving the stability of the crucible 18 when put onto another surface In the example shown on FIGS. 6 and 7, first orientation relief 40 forms a protrusion with regard to the base upper surface 34 provided by an insert rod 41 received in a depression formed in the base upper surface 34. Forming a protrusion with an insert rod 41 allows to ease manufacturing of the base upper surface 34 by avoiding high stock removal. Second orientation relief 42 comprises a depression formed in the crucible bottom surface 25. Preferably, the insert rod 41 of the first orientation relief 40 is closely fitted or welded within the depression formed in the base upper surface 34. The insert rod 41 is also configured to have a loose fit with the depression formed in the crucible bottom surface 25. In other words, the connection between the insert rod 41 and the depression formed in the base upper surface 34 is permanent whereas the connection between the insert rod 41 and the depression formed in the crucible bottom surface 25 is removable. Therefore, the crucible 18 may be easily removed from the base 22 for a replacement operation.

First 40 and second 42 orientation reliefs have preferably a circular cross-section. Alternatively, first 40 and second 42 orientation reliefs may have any shape which allows to fit them together so that the crucible 18 is removably mounted onto the base 22.

Second orientation relief 42 is preferably positioned in the central area 36 of the crucible 18. In other words, the crucible 18 is arranged such that the peripheral area 38 is free from orientation reliefs thereby allowing to provide cavities 24 at a greater distance from the rotational axis A. Therefore, more cavities 24 of a given diameter may be provided in the crucible 18 with the second orientation relief 42 disposed at the central area 36. In line with this arrangement, the first orientation relief 40 is also provided in the central area of the base 22, aligned with the second orientation relief 42 when the crucible 18 is connected to the base 22.

According to an embodiment, the crucible assembly 14 is configured so that the crucible 18 is first aligned along at least one direction perpendicular to the rotational axis A before setting the orientation of the crucible 18 around said rotational axis A. In other words, the crucible assembly 14 may be configured so that the alignment reliefs provided to the crucible 18 and the base 22 at least partly fit together before the orientation reliefs start to fit together. Thus, the crucible 18 is positioned according to at least one direction perpendicular to the rotational axis A before any contact between the orientation reliefs when the crucible 18 is connected to the base 22. Hence, the crucible 18 is first aligned with regard to the rotational axis A and can freely rotate around said rotational axis A. Then, when first 40 and second 42 orientation reliefs fit together, the rotational movement of the crucible 18 is blocked so that the angular position of the crucible 18 is set. It allows to put the alignment and orientation functions in sequence thereby facilitating the setting up of the crucible 18 on the base 22 for the operator.

This sequence is obtained with a crucible assembly 14 wherein the dimension of the orientation reliefs along the rotational axis A is smaller than the dimension of the alignment reliefs along said rotational axis A. According to a preferred embodiment shown on FIG. 7, the first orientation relief 40 is smaller than the first alignment relief 30 along the rotational axis A.

To ease replacement operation and particularly removal of the crucible 18, the crucible 18 may comprise a crucible handle 44 extending from the crucible upper surface 26. The crucible handle 44 may comprise a knob 48 mounted at the end of a rod 50. The knob 48 may be circular as shown on FIGS. 4 and 6. The assembly of the crucible handle 44 is preferably performed by providing the crucible 18 with a hole 46 in which the rod 50 is inserted. The hole 46 and the rod 50 may be connected together by a threaded connection. The crucible handle 44 is preferably disposed in the central area 36 of the crucible 18.

Figure 7:
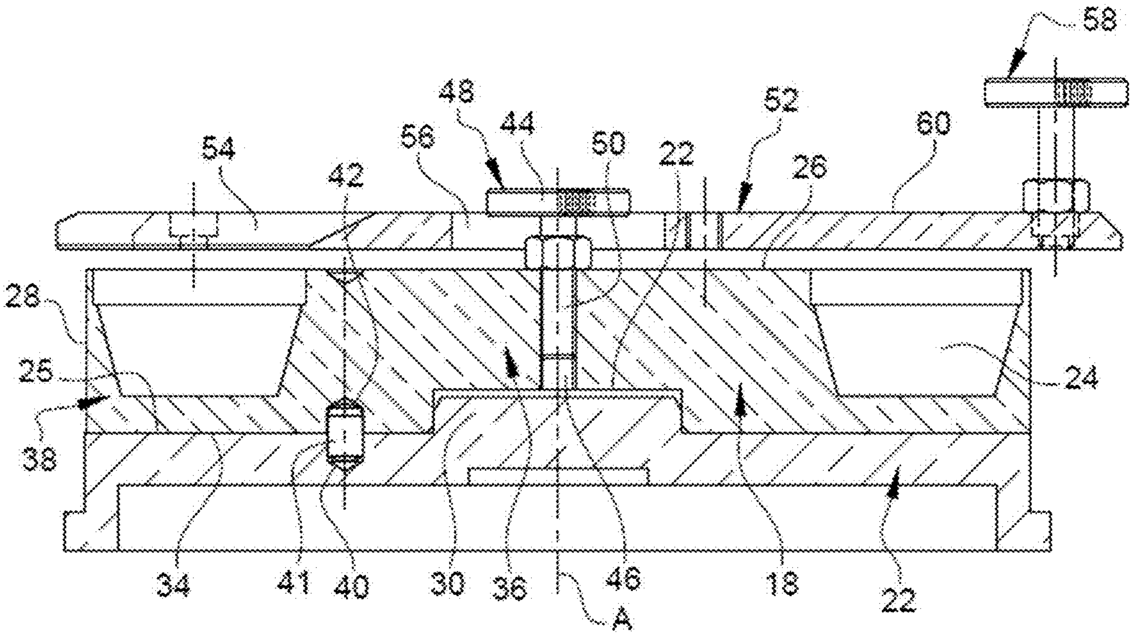
FIG. 7 shows a cross-section of the crucible assembly with the crucible connected to the base and the cover disposed above.

As shown on FIG. 7, the crucible 18 and the base 22 have substantially the same peripheral maximum dimension so that peripheral side surfaces of the crucible 18 and the base 22 are substantially aligned. Furthermore, the crucible 18 and the base 22 are preferably circular with the same diameter. In other words, the crucible 18 and the base 22 each comprises at least one peripheral side surface aligned with each other along the rotational axis A when the crucible 18 and the base 22 are connected together. Providing the crucible 18 and the base 22 with the same diameter allows to optimize the heat transfer between each other, particularly for cooling the crucible 18, while having a crucible 18 with the maximum available external diameter.

The crucible assembly 14 may further comprise a crucible cover 52 intended to be disposed above the crucible 18 to cover at least one of the cavities 24. The crucible cover 52 is removably mounted to the support 20 to remain stationary with regard to the crucible 18. The crucible cover 52 is configured to cover all the cavities 24 which are not in a position in which the material therein is in a position to be bombarded by the electron beam gun. In other words, the crucible cover 52 is configured to make only one cavity reachable by the electron beam. Alternatively, the crucible cover 52 may be configured to make a plurality of cavities 24 reachable by the electron beam when a plurality of cavities 24 are provided along a same radius with regard to the rotational axis A. The angular position of the crucible 18 allows to put a selected cavity 24 in front of the electron beam gun or in an operational position. The crucible cover 52 allows to protect all the other cavities 24 than the cavity 24 which is in this operational position. The crucible cover 52 defines a cavity cut-out or hole 54 which allows the crucible cover 52 not to cover the cavity 24 which is in said operational position. The crucible cover 52 is merely a plate with the cavity cut-out 54 formed at one side to face a cavity 24 of the crucible 18. cut-out may be opened so that the cut-out defines an external edge of the crucible cover 52 or closed so that the cut-out defines an internal edge of the crucible cover 52. The crucible cover 52 mainly extends perpendicularly to the rotational axis A when disposed above the crucible 18. The crucible cover 52 is preferably made in copper to improve heat dissipation.

The crucible cover 52 may further comprise a handle hole 56 configured to allows the crucible handle 44 to at least partly extend through the crucible cover 52 when disposed above the crucible 18. In doing so, the crucible cover 52 can be disposed very close to the crucible 18 despite the presence of the crucible handle 44. According to the embodiment shown on FIGS. 6 and 7, the handle hole 56 may be circular.

The crucible cover 52 may further comprise at least one cover handle 58 extending from a cover upper surface 60 of the crucible cover 52. This cover handle 58 allows to facilitate the removal of the crucible cover 52 and thus the replacement operation. Indeed, the temperature of the crucible cover 52 can be very high when the material in the cavity 24 is vaporized. Allowing the operator not to directly touch the body of the crucible cover 52 is thus safer and more comfortable. The crucible handle 58 thus prevents the operator to be burnt. The crucible cover 52 may comprise at least two cover handles 58 to further facilitate the handling of the crucible cover 52. The cover handle 58 preferably comprises a knob mounted at the end of a rod. This rod is fixed at the cover upper surface 60.

A method is further proposed for depositing a coating on a surface 17 using a physical vapor deposition machine 10 as described above. This method comprises a replacement operation or step for providing the crucible assembly 14 with new material to be vaporized. The machine 10 comprises two crucibles 18 including a first crucible 18 intended to be active, i.e. disposed onto the base 22 to perform a vaporization step, and a second crucible 18 intended to be a refill crucible 18, i.e. which may be cleaned and/or refill during a vaporization step to provide new material for a next replacement operation.

Firstly, the cavities 24 of the first crucible 18 are filled with a first set of materials. The first set of materials and the position thereof in the crucible 18 are determined depending on the coating to be applied on the surface 17. As an example, a first anti-reflecting coating may comprise the following layers, listed from the surface to the outside of the coating: silica, zircon, silica, zircon, silica, zircon, tin dioxide/Indium tin oxide, silica, magnesium fluoride and magnesium oxide. A second anti-reflecting coating may comprise the same layers as the first anti-reflecting coating with a silica layer between the third zircon layer and the tin dioxide/indium tin oxide layer.

The first crucible 18 is positioned onto the base 22 which has been previously fixed to the support 20. Particularly, the first crucible 18 is connected to the base 22 such that first 30 and second 32 alignment reliefs fit together and that the crucible bottom surface 25 and the base upper surface 34 are in contact with each other. When the crucible 18 and the base 22 comprise orientation reliefs, said connection is performed such that first 40 and second 42 orientation reliefs also fit together. Furthermore, the crucible cover 52 is then disposed above the first crucible 18 and fixed to the support 20.

The electron beam gun is then actuated to vaporize material disposed in the cavity 24 which is in the operational position. Said cavity 24 is therefore not covered by the crucible cover 52.

When a replacement operation is needed, i.e. when at least one material received in the first crucible 18 needs to be replaced, the crucible cover 52 is removed from the support 20. The first crucible 18 is then removed from the base 22.

According to a preferred embodiment, a second crucible 18 comprising a second set of materials is connected to the base 22 to replace the first crucible 18. The crucible cover 52 is then positioned and fixed above the second crucible 18 to allow another actuation step of the electron beam gun to be performed. The second crucible 18 is filled with the second set of materials prior to the replacement operation to make this replacement very fast. Most preferably, the second crucible 18 is filled with the second set of materials and/or cleaned during the actuation step of the electron beam gun to further optimize the vaporization process.

In an alternative embodiment, only one crucible 18 is used so that the first crucible 18 may be cleaned and filled again with a second set of materials. The first crucible 18 with the second set of materials is then positioned on the base 22 to perform another actuation step of the electron beam gun.

According to an alternative embodiment, the crucible handle 44 and the at least one cover handle 58 are designed as a "plug and play" device. In this embodiment as shown on FIGS. 9-11, the crucible handle 44 and the at least one cover handle 58 are made of a first part 62 fixed to the crucible 18 and the crucible cover 52, respectively, and a second part 64 which is configured to be removably connected to the first part 62 to handle the crucible 18 and/or the crucible cover 52. The first part 62 comprises rod 66 fixed to the crucible 18 or the crucible cover 52. The second part 64 comprises a removable handle 68 with a control knob 70 that can be actuated to lock or unlock the removable handle 68 when the first and second parts are connected together, i.e. when the rod 66 is inserted within the removable handle 68. The control knob 70 preferably comprises a through hole 72 within which the rod 66 is retained when the removable handle 68 is locked. A resilient part, as a spring, is lodged between a wall of the removable handle 68 and the control knob 70 to retain the control knob 70 in a locking position. This embodiment of the crucible handle 44 and the at least one cover handle 58 allows to deeply reduce the risks of burns of the user. Indeed, when the handle is kept in place on the crucible 18 and the crucible cover 52 during the process, it has been observed that the handle is very warm. This removable handle embodiment allows to keep the handle in a cold place during the electron beam gun is used and connect it to the crucible 18 and/or to the crucible cover 52 only when a manipulation is required.

Figure 9:
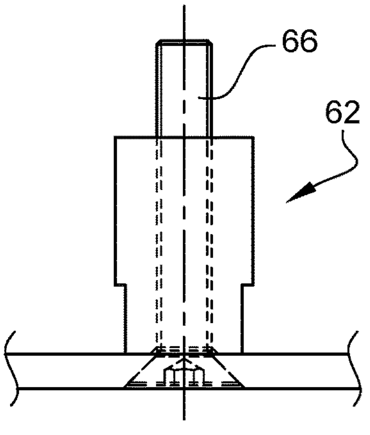
FIGS. 9 to 11 show an alternative embodiment of a crucible or cover handle.
Figure 11:
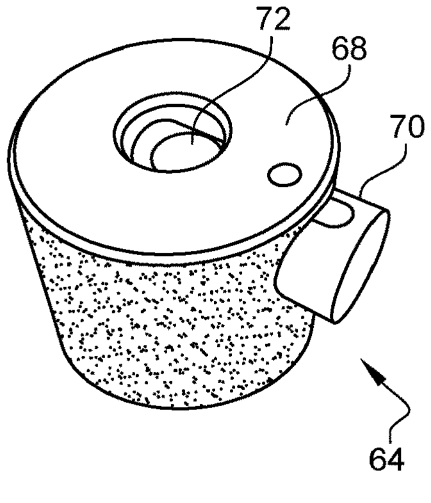
Figure 10:
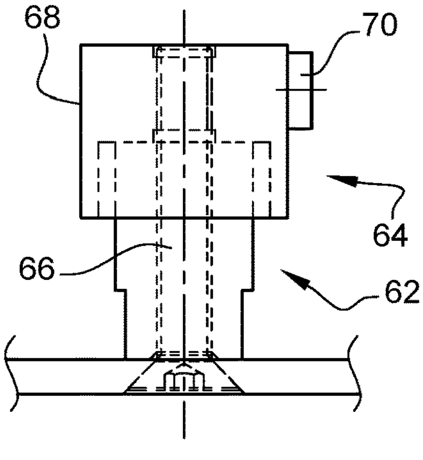

According to another embodiment, the crucible handle 44 and the at least one cover handle 58 are identical to the embodiment of FIGS. 9-11 but a safety function is provided. This safety function is performed by providing a portion of the rod 66 with a reduced diameter while keeping a larger diameter at the end of the rod 66 so as to form an axial stop. In doing so, the control knob 70 of the second part 64 may be retained by the axial stop when put in the locked position. The axial stop is preferably a shoulder formed on the rod 66.

An alternative embodiment of the crucible assembly is described herein below with reference to FIGS. 12 to 14.

This alternative embodiment differs from the crucible assembly 14 described with reference to FIGS. 3 to 7 that it comprises an alternative arrangement of the alignment reliefs and the orientation reliefs on the crucible and the base. This alternative arrangement is less expensive and allows to reduce manufacturing time.

The support 20 and the cover 52 may be used with the crucible and the base of this alternative crucible assembly.

Figure 12:
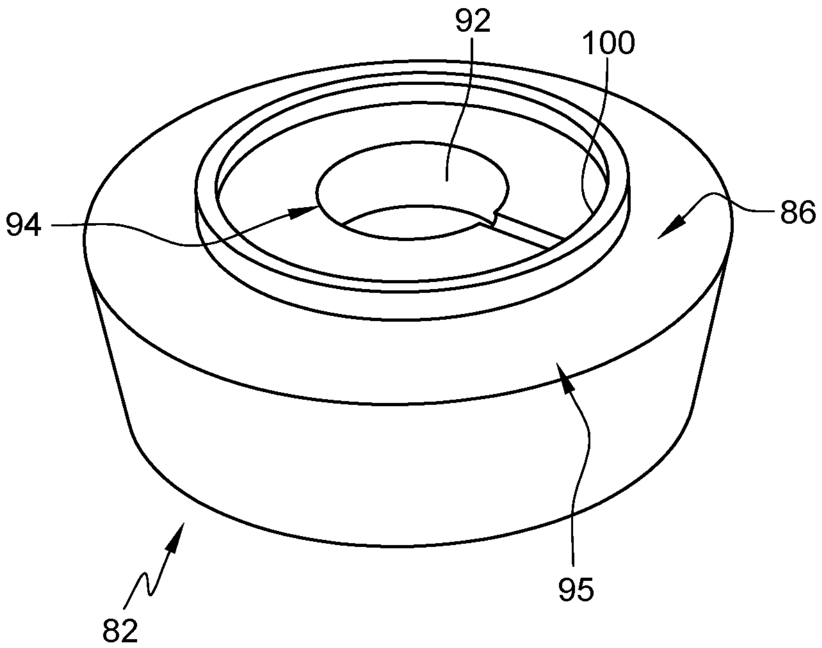
FIGS. 12 to 14 show respectively a perspective view, a top view and a cross-section view of an alternative embodiment of crucible assembly.
Figure 13:
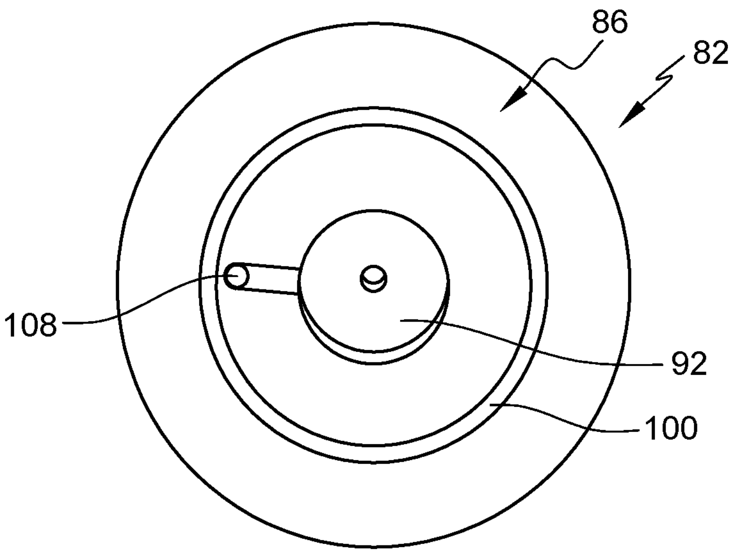
Figure 14:
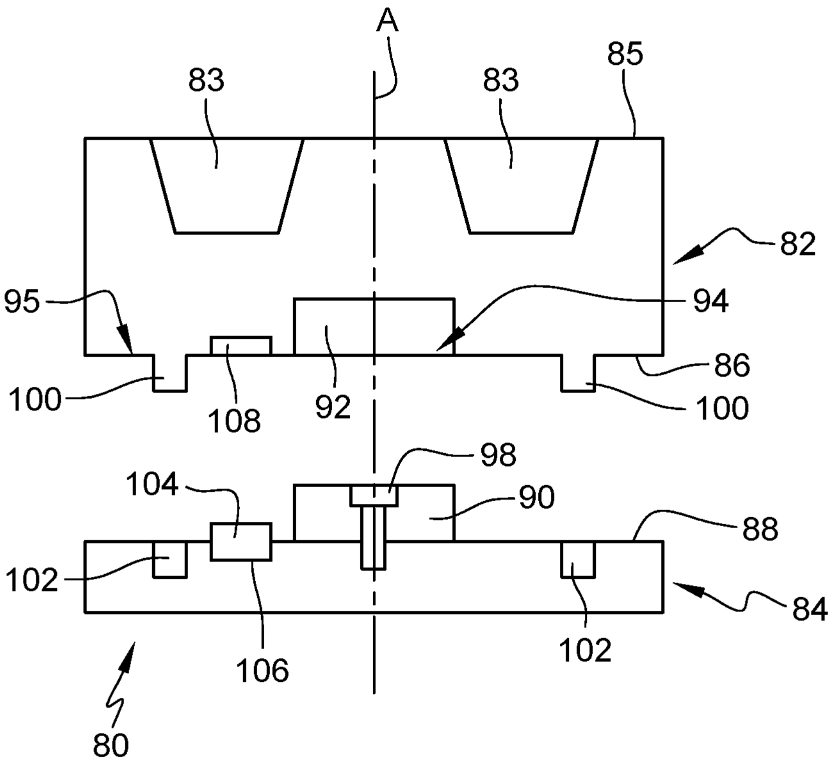

As shown on FIGS. 12 to 14, a crucible assembly 80 comprises a crucible 82 configured to receive material to be vaporized and a base 84. Crucible 82 also comprises a plurality of cavities 83 configured to receive material to be vaporized. The cavities 83 are formed at a crucible upper surface 85 which may comprise all the features and provide all the technical effects described in reference to the crucible assembly 14.

Crucible 82 is configured to be connected to the base 84 so that a crucible bottom surface 86 is put in contact with a base upper surface 88.

Alignment between the base 84 and the crucible 82 is performed by a removable alignment part 90 fastened to the base upper surface 88. This removable alignment part 90 protrudes from the base upper surface 88 and is received within an alignment cavity 92 formed within the crucible bottom surface 86. The removable alignment part 90 is configured to be positioned at a central area 94 of the crucible bottom surface 86. This central area 94 is defined as the central area 36 in the crucible assembly 14. The removable alignment part 90 may be fastened to the base 84 by means of a screw 98. Alternatively, the removable alignment part 90 may be fastened to the base 84 by any fastening means. The removable alignment part 90 and the alignment cavity 92 are preferably complementary shaped. The removable alignment part 90 is preferably cylindrical.

Alternatively, this alignment arrangement may be reversed with the removable alignment part 90 fastened to the crucible bottom surface 86 and the alignment cavity 92 formed within the base upper surface 88.

Providing the alignment arrangement with a removable part allows to ease manufacturing of the base upper surface 88 by avoiding high stock removal. Manufacturing time and thus manufacturing costs are reduced. The removable alignment part 90 is preferably made of stainless steel.

Crucible 82 and base 84 are provided with additional alignment means which comprise an alignment rim 100 and an alignment groove 102 intended to cooperate which each other when the crucible 82 is connected to the base 84. The alignment rim 100 is preferably provided onto the crucible bottom surface 86 and the alignment groove 102 is formed within the base upper surface 88. Alternatively, this additional alignment arrangement may be reversed with the alignment rim 100 onto the base upper surface 88 and the alignment groove 102 formed within the crucible bottom surface 86.

These additional alignment means are provided at a peripheral area 95 of the crucible 82. This peripheral area 95 is defined as the peripheral area 38 in the crucible assembly 14.

These additional alignment means provide an improved alignment between the crucible 82 and the base 84.

Crucible 82 and base 84 are further provided with orientation means which comprise an insert rod 104 received in a fastening depression 106 formed in the base upper surface 88 as well as an orientation depression 108 formed in the crucible bottom surface 86 configured to receive the insert rod 104. Forming a protrusion with the insert rod 104 allows to ease manufacturing of the base upper surface 88 by avoiding high stock removal. Preferably, the insert rod 104 is closely fitted or welded within the fastening depression 106. The insert rod 104 is also configured to have a loose fit with the orientation depression 108 formed in the crucible bottom surface 86. In other words, the connection between the insert rod 104 and the fastening depression 106 is permanent whereas the connection between the insert rod 104 and the orientation depression 108 is removable. Therefore, the crucible 82 may be easily removed from the base 84 for a replacement operation.

These orientation means are provided at a peripheral area 95 of the crucible 82.

The invention claimed is:

1. A crucible assembly for physical vapor deposition on a surface comprising:
- a base to support and drive in rotation a crucible around a rotational axis,
- a crucible cover configured to cover at least one of the cavities of the crucible when the crucible cover is disposed above the crucible,
- wherein the crucible comprises:
  - at least two cavities for receiving a material to be vaporized by an electron beam gun, the at least one cavity being disposed at a peripheral area of the crucible with regard to the rotational axis,
  - a crucible upper surface from which the at least two cavities extend,
  - wherein the crucible comprises a crucible handle extending from the crucible upper surface, the crucible cover having a first hole which allows the crucible cover not to cover the cavity which is in an operational position, and a second hole configured to make the crucible handle extend through the crucible cover when disposed above the crucible,
  - wherein the crucible cover comprises a cover handle extending from a cover upper surface of the crucible cover,
  - wherein the crucible handle is made of a first part fixed to the crucible and a second part which is configured to be removably connected to the first part to handle the crucible, the cover handle being made of a first part fixed to the crucible cover and a second part which is configured to be removably connected to the first part to handle the crucible cover to allow second part of both crucible and cover handle to be removed during the electron beam gun is used to keep the handle in a cold place.

2. The crucible assembly according to claim 1, wherein the crucible comprises at least ten cavities disposed at the peripheral area around the rotational axis.

3. The crucible assembly according to claim 1, wherein the crucible comprises a crucible upper surface from which the at least one cavity extends, the crucible upper surface being a circular surface centered around the rotational axis and defining an external diameter, and wherein:

the central area is a circular area extending radially from the rotational axis to 60% of the external diameter, and the peripheral area is an annular area extending radially from 61% of the external diameter to 100% of the external diameter.

4. The crucible assembly according to claim 1, wherein the first and second alignment reliefs provide an alignment stop of the crucible along at least one direction perpendicular to the rotational axis.

5. The crucible assembly according to claim 1, wherein the base is disk-shaped with the base upper surface provided on one side of the disk, the first alignment relief comprising a protrusion centered with regard to the rotational axis.

6. The crucible assembly according to claim 1, wherein the crucible is disk-shaped with the crucible bottom and upper surfaces provided on each side of the disk, the second alignment relief comprising a depression centered with regard to the rotational axis.

7. The crucible assembly according to claim 1, wherein the base comprises a base upper surface, has a first alignment relief, and the crucible comprises:

a crucible bottom surface intended to contact the base upper surface of the base, the crucible bottom surface having a second alignment relief which is complementary shaped with regard to the first alignment relief so as to align both the base and the crucible with regard to the rotational axis when the crucible bottom surface contacts the base upper surface and the first and second alignment reliefs are brought one into the other, the second alignment relief being disposed at a central area of the crucible with regard to the rotation axis.

8. The crucible assembly according to claim 7, wherein the first and second alignment reliefs are a depression formed in the crucible bottom surface and a protrusion protruding from the base upper surface.

9. The crucible assembly according to claim 1, wherein the base upper surface further comprises a first orientation relief, the crucible bottom surface further comprises a second orientation relief which is complementary shaped with regard to the first orientation relief so as to position the crucible at a predetermined angular orientation with regard to the base when the crucible bottom surface contacts the base upper surface and the first and second orientation reliefs are brought one into the other.

10. The crucible assembly according to claim 9, wherein the second orientation relief is positioned at the central area of the crucible.

11. The crucible assembly according to claim 9, wherein the dimension of the first orientation relief along the rotational axis is smaller than the dimension of the first alignment relief along said rotational axis.

* * * * *